United States Patent
Bojkov et al.

(10) Patent No.: US 6,927,493 B2
(45) Date of Patent: Aug. 9, 2005

(54) SEALING AND PROTECTING INTEGRATED CIRCUIT BONDING PADS

(75) Inventors: Christo P. Bojkov, Plano, TX (US); Michael L. Krumnow, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/678,709

(22) Filed: Oct. 3, 2003

(65) Prior Publication Data
US 2005/0073048 A1 Apr. 7, 2005

(51) Int. Cl.$^7$ .......................... H01L 23/48; H01L 23/52; H01L 29/40
(52) U.S. Cl. .......................... 257/753; 257/758; 257/762
(58) Field of Search .................................. 257/750, 753, 257/758, 762

(56) References Cited

U.S. PATENT DOCUMENTS

2004/0173905 A1 * 9/2004 Kamoshima et al. ....... 257/758
2004/0238961 A1 * 12/2004 Cunningham ............... 257/758

* cited by examiner

*Primary Examiner*—Ngân V. Ngô
(74) *Attorney, Agent, or Firm*—Yingsheng Tung; Wade James Brady, III; Frederick J. Telecky, Jr.

(57) ABSTRACT

A metal structure (600) for a bonding pad on integrated circuit wafers, which have interconnecting metallization (101) protected by an insulating layer (102) and selectively exposed by windows in the insulating layer. The structure comprises a patterned seed metal layer (104) positioned on the interconnecting metallization exposed by the window so that the seed metal establishes ohmic contact to the metallization as well as a practically impenetrable seal of the interface between the seed metal and the insulating layer. Further, a metal stud (301) is formed on the seed metal and aligned with the window. The metal stud is conformally covered by a barrier metal layer (501) and an outermost bondable metal layer (502).

14 Claims, 3 Drawing Sheets

SEALING AND PROTECTING INTEGRATED CIRCUIT BONDING PADS

FIELD OF THE INVENTION

The present invention is related in general to the field of metallurgical systems with application to electronic systems and semiconductor devices and more specifically to methods for sealing and protecting integrated circuit bonding pads.

DESCRIPTION OF THE RELATED ART

It is a continuing trend in the semiconductor industry to miniaturize integrated circuits (ICs). As a consequence of this trend, the RC time constant of the interconnection between active circuit elements increasingly dominates the achievable IC speed-power product. Consequently, there is a strong need to replace the relatively high impedance of the interconnecting aluminum metallization by the lower impedance of metals such as copper.

For IC bond pads made of copper, the formation of thin copper(I)oxide films during the manufacturing process flow severely inhibits reliable attachment of bonding wires, especially for conventional gold-wire ball bonding. In contrast to aluminum oxide films overlying metallic aluminum, copper oxide films overlying metallic copper cannot easily be broken by a combination of thermo-compression and ultrasonic energy applied in the bonding process. As further difficulty, bare copper bond pads are susceptible to corrosion.

In order to overcome these problems, several investigations aim at developing a process to cap the clean copper bond pad with one or more metal layers. So far, the process favored by the industry is based on forming a layer of aluminum over the copper bond pad and thus re-constructing the traditional situation of an aluminum pad to be bonded by conventional gold-wire ball bonding. This process, though, has a number of drawbacks due to technical and cost issues.

An alternative process is based on the concept of depositing a stack of layers on the copper, wherein the layer closest to the copper acts as a barrier to shield the copper from diffusing into other metals, and the outermost layer is bondable by the conventional gold ball of wire bonding. This process still needs the satisfactory solution of technical problems, such as adhesion among the various metal layers and insulating materials; avoidance of corrosion and chemical undercuts; and increased flexibility in the methods of depositing and removing the metal and insulator films.

A need has therefore arisen for a metallurgical bond pad structure suitable for ICs having copper interconnection metallization which combines a low-cost method of fabricating the bond pad structure with high reliability in operating the structure, in particular with reduced possibility of delamination and corrosion. The bond pad structure and the method of fabrication should be flexible enough to be applied for different IC product families and a wide spectrum of design and process variations. Preferably, these innovations should be accomplished while shortening production cycle time and increasing throughput and yield, and without the need of expensive additional manufacturing equipment.

SUMMARY OF THE INVENTION

One embodiment of the invention is a semiconductor device including a bonding pad having interconnecting metallization protected by an insulating layer; the metallization is selectively exposed by a window in the insulating layer. The device comprises a patterned seed metal layer positioned on the interconnecting metallization exposed by the window and overlapping a portion of the insulating layer around the window. Further, a metal stud is positioned on the seed metal and aligned with the window; the stud includes a top surface and side surfaces. A barrier metal layer covers conformally the top and side surfaces of the stud. An outermost bondable metal layer is over the barrier metal layer.

For interconnecting device metallization of copper, the preferred seed metal is a stack of layers: a layer of titanium/tungsten contacting the copper metallization, followed by a layer of copper; alternatively, the seed metal may be a layer of copper. For interconnecting device metallization of aluminum, the seed metal is a stack of titanium/tungsten and copper layers. Further, copper is preferred as the stud metal. In this case, the preferred barrier metal is nickel, the second barrier metal is palladium, and the outermost layer is gold. An alternate stud metal is nickel; in that case, the preferred barrier metal is palladium and the outermost metal is gold.

Another embodiment of the invention is a method for fabricating a semiconductor device having interconnecting metallization protected by an insulating layer; the metallization is selectively exposed by windows in the insulating layer. The method comprises the step of depositing a conductive seed layer to cover the metallization exposed in the window and to cover a portion of the insulating layer around the window. The next step forms a metal stud over the conductive seed layer covering the metallization exposed by the window and over the portion of the insulating layer around the window; the metal stud includes a top surface and side surfaces. Next, the conductive seed layer portions not covered by the metal stud are removed. The final steps comprise conformally covering the top and side surfaces of the metal stud with a barrier metal, and depositing an outermost bondable metal layer over the barrier layer.

The step of depositing a conductive seed layer can be preceded by a step of cleaning and etching the surface of the wafer, including the insulating layer and the exposed metallization, creating a fresh and activated surface. The seal provided by the prepared insulating layer and the deposited seed metal withstands operational thermomechanical stress.

In another embodiment of the invention, the interconnecting chip metallization is an aluminum alloy. The preferred seed metal is an alloy of refractory metals, including titanium and tungsten.

In yet another embodiment of the invention, the metal stud is nickel.

Embodiments of the present invention are related to wire-bonded IC assemblies, semiconductor device packages, surface mount and chip-scale packages. It is a technical advantage that the invention offers a low-cost method of sealing the bond pad against moisture and delamination, and thus for protecting the integrated circuit against corrosion and stress-related contact failure. It is an additional technical advantage that the invention offers a methodology to smooth, stable interfaces of the gold wire ball and the modified bond pad, resulting in welds with strong metallic interdiffusion. Further technical advantages include the opportunity to scale the assembly to smaller dimensions, supporting the ongoing trend of IC miniaturization; and the absence of unwanted metals, supporting high reliability of the finished IC assemblies.

The technical advantages represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 1A to 6B are schematic cross sections illustrating certain steps of the process flow for completing the fabrication of a bonding pad on an integrated circuit wafer.

FIG. 1A depicts the deposition of a seed metal layer needed for applying electrical potential in the plating process of a stack of interface layers over the wafer metallization.

FIG. 2 illustrates the forming of a patterned photoresist layer.

FIG. 3 shows the deposition of a buffer layer over the portion of the seed layer exposed in the photoresist window.

FIG. 4 illustrates the removal of the patterned photoresist layer and the underlying portions of the seed metal layer.

FIG. 6B shows a metal wire connected to a bond pad positioned on an integrated circuit according to another embodiment of the invention.

DETAILED DESCRIPTION OF THE PREFERRED EMBODIMENTS

The present invention is related to U.S. patent application Ser. No. 10/086,117, filed on Feb. 26, 2002 (Bojkov et al., "Waferlevel Method for Direct Bumping on Copper Pads in Integrated Circuits").

Figure 1A:
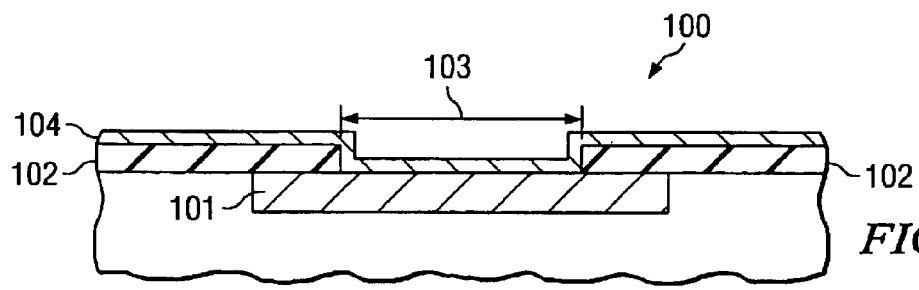

FIGS. 1A to 6B are schematic cross sections illustrating certain steps in the process flow for completing the fabrication of a bonding pad on an integrated circuit (IC) wafer. FIG. 1A shows schematically a portion of a semiconductor wafer, generally designated 100, having interconnections 101 and a protective overcoat 102. The semiconductor material is preferably silicon, but may alternatively be silicon germanium, gallium arsenide, or another III–V or II–IV semiconductor. The interconnection 101 is preferably copper; alternatively, aluminum or aluminum/copper alloy, or similar materials can be employed. The protective overcoat 102 is preferably silicon nitride, but may alternatively be silicon oxynitride, silicon carbide, silicon dioxide, or a polymer such as polyimide, for example. A window of width 103 in overcoat 102 exposes metallization 101 selectively.

The semiconductor wafer 100 including the protective overcoat 102 and the exposed metallization 101 is subjected to a series of cleaning and etching steps as follows: exposing the wafer to organic solvents, thereby removing organic contamination and mechanical particles from the copper contact pads; drying the wafer in dry nitrogen; exposing the wafer to an oxygen and nitrogen/helium/argon plasma, thereby ashing any further organic residues on the copper contact pads and oxidizing the copper surface to a controlled thickness; and, without breaking the vacuum of the plasma chamber, exposing the wafer to a hydrogen and nitrogen/helium/argon plasma, thereby removing the controlled copper oxide from the surface of the exposed copper metallization and passivating the cleaned surface, which is then sputter-etched with energetic ions so that a fresh and activated surface is created.

More specifically, the step of exposing the wafer to solvents may be selected from processes such as submerging the wafer in agitated isopropyl alcohol (or, alternatively, in methanol, glycol, or N-methylpyrrolidone, for example); adding ultrasonic energy to the solvent; spraying the wafer with an organic solvent; and treating the wafer in dry chemical vapor. Between the steps of oxygen plasma and hydrogen plasma, there may be a step of etching the wafer in an aqueous inorganic or organic acid, which helps to remove deep metal defects in the exposed windows 103.

Figure 1B:
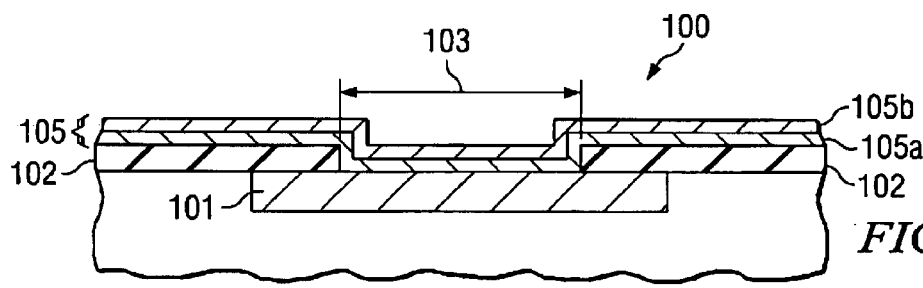
FIG. 1B depicts the deposition of a stack of seed metal layers.

Without delay, a layer 104 of seed metal is then deposited to cover the fresh and activated surface of the wafer, preferably by a sputtering technique without breaking the chamber vacuum. When the chip metallization is copper, the seed metal may be a copper layer 104 as shown in FIG. 1A. Preferably, however, the seed metal is a stack of a refractory metal layer (for example, titanium/tungsten) 105a (facing the chip metallization 101) and a copper layer 105b, as shown in FIG. 1B. Refractory layer 105a and copper layer 105b together form seed metal layer 105. Other options for layer 105a include one or more refractory metals such as tantalum, titanium, tungsten, molybdenum, chromium, nickel, vanadium, or an alloy of any of these metals. When the chip metallization 101 is aluminum or an aluminum alloy, the seed metal is a stack of a refractory metal/alloy layer (contacting the aluminum) and a copper layer.

Layers 104 and 105 exhibit low electrical resistance, ohmic contact, and low thermo-mechanical stress to the metal pad 101; it is, therefore, well suited for the following plating step. Furthermore, layers 104 and 105 exhibit strong adhesion to the chip metallization 101 as well as the protective overcoat 102. Due to the adhesion, the interface between the seed metals 104 and 105 and the insulating layer 102 provides a practically impenetrable seal against moisture or particles ingress from the ambient environment.

Figure 2:
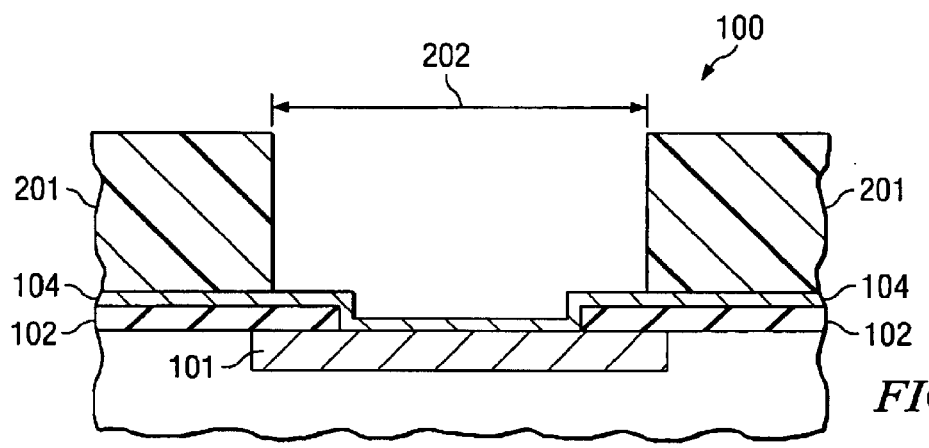

Referring now to FIG. 2, it illustrates the forming and patterning of a photoresist layer 201. The photoresist pattern defines the opening 202, which exposes the seed metal layer over the interconnecting wafer metallization 101 (for simplicity, the seed metal is represented in FIG. 2 and all following FIGs. only by the single layer 104; all considerations under discussion, however, apply equally to the stack of layers 105). The process flow continues with the step of exposing the seed metal layer 104 in the opening 202 to a hydrogen and nitrogen/argon plasma, which cleans and passivates the seed metal layer 104 in the photoresist opening 202.

Figure 3:
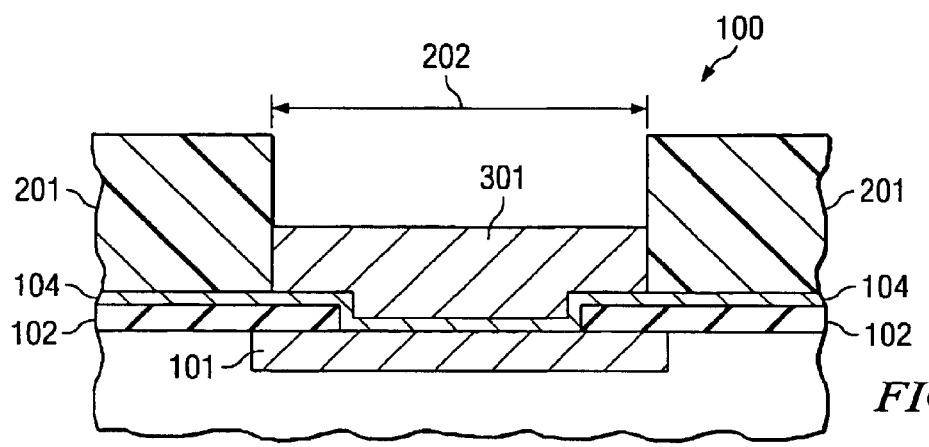

In FIG. 3, a buffer metal layer 301 is deposited onto the seed metal layer 104 exposed in the photoresist opening 202. The preferred material of layer 301 is copper in the thickness range from about 1 to 20 $\mu$m. Alternatively, nickel can be used; its thickness is about 0.5 to 10 $\mu$m. Because of its relative thickness, buffer layer 301 is frequently referred to as a "stud". The deposition is executed without exposing the passivated seed metal layer 104 to fresh contamination, whereby two options are available: the preferred method is electrolytic plating; an alternative method is electroless plating.

When the buffer layer 301 is deposited as a copper layer by an electroless plating process, it is advantageous to use a plating bath for fine grain, low stress deposits. As an example, a suitable plating bath is commercially available as the "Circuposit" electroless copper 3350 from Shipley Company, Marlborough, Mass., USA.

Figure 4:
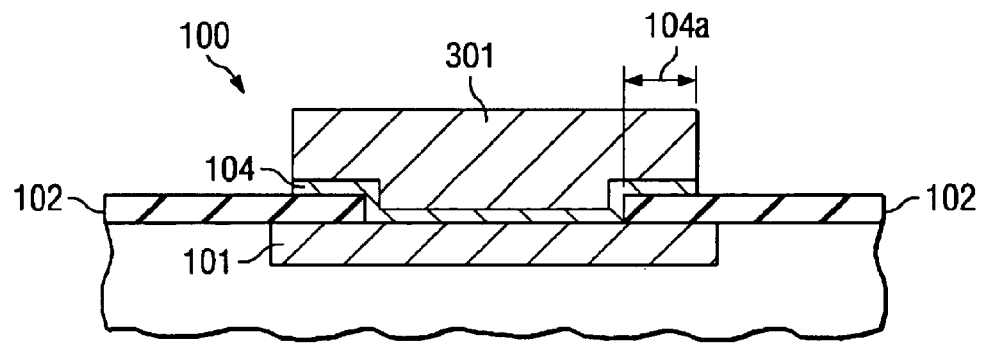

In FIG. 4, the photoresist material is stripped; this step exposes the portions of the seed layer 104 outside of the stud 301. These seed layer portions are then removed by etching, conveniently in a wet etch solution of $H_2SO_4$, $H_2O_2$, and $NH_4OH$. It is inconsequential, if small portions of the stud 301 (of the order of 1 to 3 μm thickness) are also removed in this etching process, since there is enough overlap 104a (5 to 15 μm) over the protective overcoat 102 around the periphery of window 103. In this etching process, the stud 301 may receive slightly "rounded" contours.

Figure 5A:
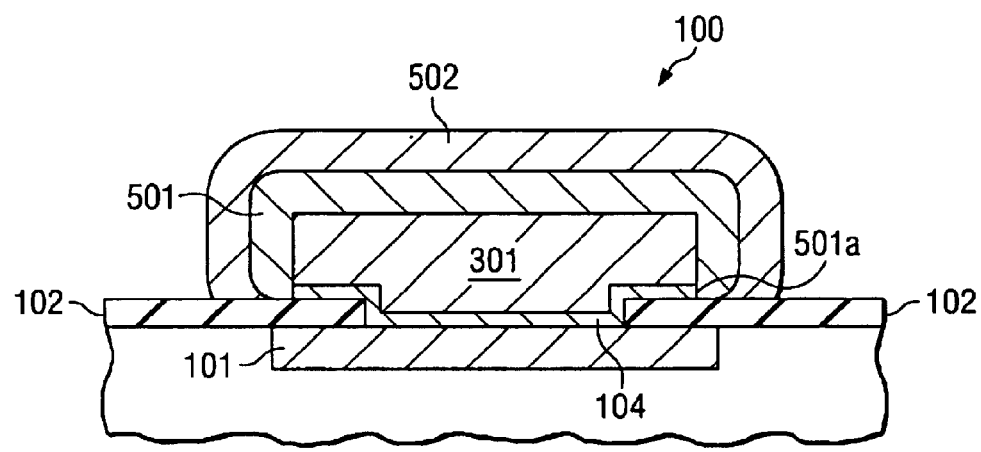
FIG. 5A illustrates the electroless deposition of a barrier metal layer and an outermost metal layer over the buffer layer according to an embodiment of the invention.
Figure 5B:
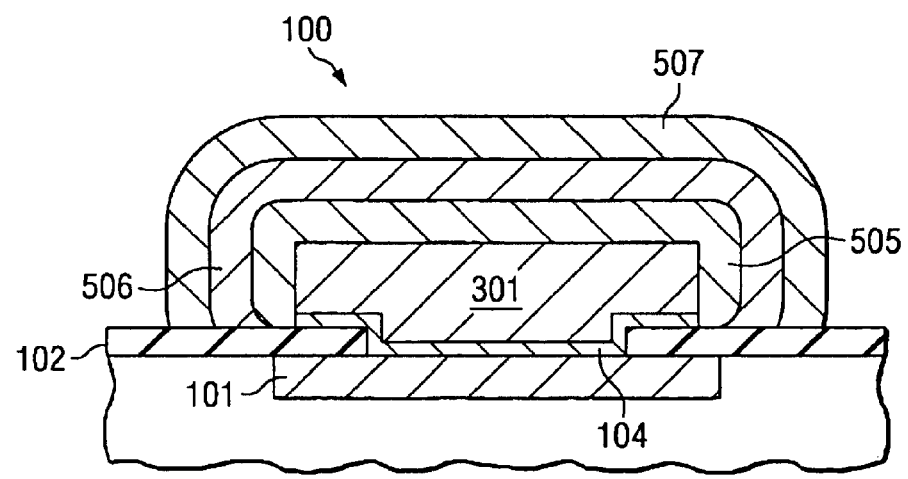
FIG. 5B illustrates the electroless deposition of two barrier layers and an outermost layer over the buffer layer according to another embodiment of the invention.

FIG. 5A illustrates the sequential deposition of a barrier layer and an outermost layer for one embodiment of the invention, FIG. 5B shows the analogous deposition of two barrier layers and an outermost layer for another embodiment. In FIG. 5A, layer 501 is deposited over the stud 301, preferably by an electroless plating technique. Material and thickness of layer 501 are selected to let layer 501 act as a barrier layer that resists diffusion of the stud metal. If stud 301 is made of copper, barrier layer 501 resists copper diffusion. Usually, the material of layer 501 is less noble than copper and is preferably nickel; other options include tin, lead, cobalt, iron, chromium, zinc, magnesium, aluminum, and alloys thereof. When nickel is selected as barrier metal, layer 501 has a preferred thickness range from 1 to 5 μm. (As commonly practiced, the term "more noble metal" or "less noble metal" refers to the relative position of that particular metal compared to another metal in the table of electrochemical potentials, in which all metals are rank-ordered for their ability to be oxidized; the lower a metal is ranked, the harder it is to be oxidized and thus the more "noble" it is).

As FIG. 5A shows, barrier layer 501 is deposited over stud 301 so that the exposed sides of stud 301 are conformally covered. There is no undercut in the region 501a, where barrier layer 501 joins the insulating layer 102.

Next, the outermost layer 502 is deposited over barrier layer 501, again preferably by an electroless plating technique. As FIG. 5A shows, layer 502 covers the exposed sides of barrier layer 501. The top surface of the outermost layer 502 is smooth; its average surface roughness is less than about 50 nm. The material of layer 502 is preferably more noble than the material of layer 501 and the stud 301, and is selected so that it is wire bondable (ball, wedge, and ribbon bonding), meaning that a wire or ribbon will reliably adhere to the surface. Due to the surface smoothness of layer 502, wire bonding provides uniform metal interdiffusion and thus reliable welds. Preferably, layer 502 is made of gold or palladium; other options include silver, platinum, and alloys thereof. When gold is selected, layer 502 has a preferred thickness range from about 50 and 250 nm; in some applications, gold layers up to about 3 μm thickness are used.

Figure 6A:
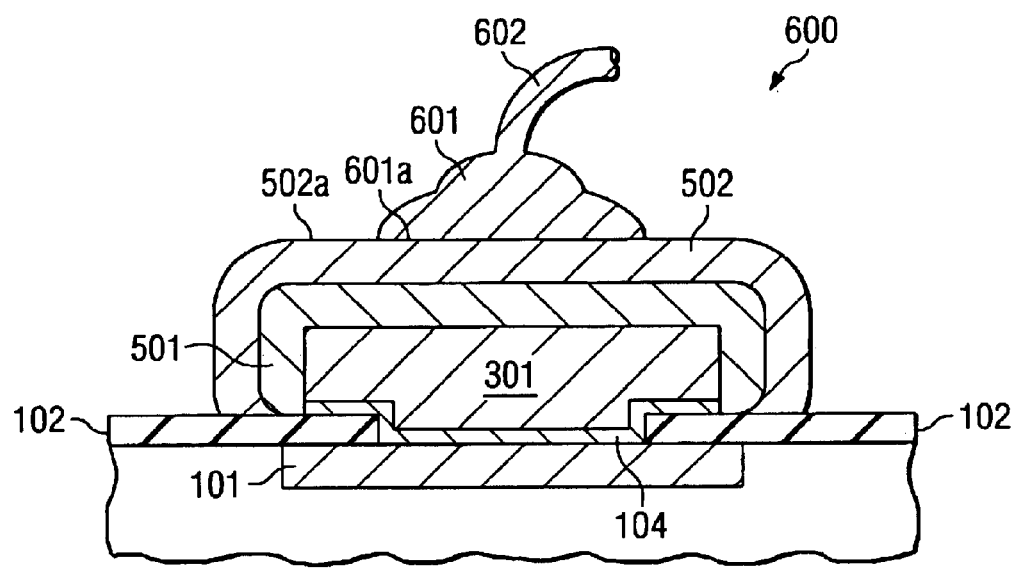
FIG. 6A shows a metal wire connected to a bond pad positioned on an integrated circuit according to an embodiment of the invention.

Referring now to FIG. 6A, the cross section indicates schematically the attachment of a ball bond 601 to the outermost layer 502 of the bond pad metallization. The preferred metal for the bonding wire 602 is gold; other options include copper, aluminum, silver, and alloys thereof. Due to the low surface roughness 502a of less than about 50 nm, the interface 601a of the wire ball-to-layer surface is smooth, providing uniform metal interdiffusion at the interface 601a and thus a reliable weld.

The embodiment of FIG. 5B shows two barrier layers 505 and 506, instead of only one barrier layer 502 as in FIG. 5A.

First barrier layer 505, positioned directly on metal stud 301, resists the diffusion of the stud metal (for example, copper), while second barrier layer 506, positioned on first barrier layer 505, resists the diffusion of the first barrier metal. When the stud metal is copper, the first barrier material is preferably nickel; other choices include tin, lead, cobalt, iron, chromium, zinc, magnesium, aluminum, and alloys thereof. For nickel, the preferred thickness range of layer 505 is between 1 and 5 μm. The second barrier material is preferably palladium; other options include cobalt, platinum and osmium. For palladium, the preferred thickness range of layer 506 is between 0.1 and 0.5 μm. The deposition method for layers 505 and 506 is preferably electroless plating.

The outermost layer 507 is deposited over barrier layer 506, preferably by electroless plating. The surface of the outermost layer 507 is smooth; its average surface roughness is less than about 50 nm. The material of layer 507 is preferably more noble than the material selected for layers 505 and 506 and stud 301, and is selected so that it is wire bondable (ball, wedge, and ribbon bonding). Due to the surface smoothness of layer 507, wire bonding provides uniform metal interdiffusion and thus reliable welds. Preferably, layer 507 is made of gold; other options include platinum, palladium, silver, and alloys thereof. When gold is used, layer 507 is preferably in the thickness range from about 50 to 250 nm.

Figure 6B:
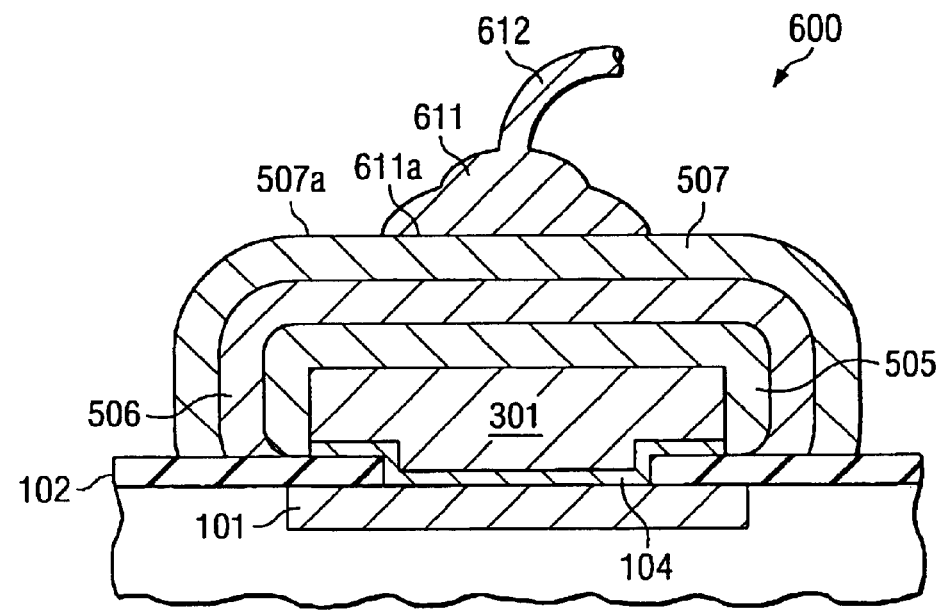

Referring now to FIG. 6B, the cross section indicates schematically the attachment of a ball bond 611 to the outermost layer 507 of the bond pad metallization. The preferred metal for the bonding wire 612 is gold; other options include copper, aluminum, silver, and alloys thereof. Due to the low surface roughness 507a of less than about 50 nm, the interface 611a of the wire ball-to-layer surface is smooth, providing uniform metal interdiffusion at the interface 611a and thus a reliable weld.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications and embodiments.

We claim:

1. A semiconductor device including a bonding pad having interconnecting metallization protected by an insulating layer, said metallization selectively exposed by a window in said insulating layer, comprising:
    a patterned seed metal layer positioned on said interconnecting metallization exposed by said window and overlapping a portion of said insulating layer around said window;
    a metal stud on said seed metal, said stud aligned with said window, said stud including a top surface and side surfaces;
    a barrier metal layer conformally covering the top and side surfaces of said stud; and
    an outermost bondable metal layer over said barrier metal layer.

2. The device according to claim 1 wherein said outermost metal layer conformally covers said barrier layer and provides a flat surface having an average roughness of less than about 50 nm.

3. The device according to claim 1 further comprising a bond wire attached to said outermost metal.

4. The device according to claim 1 wherein said interconnecting metallization comprises copper.

5. The device according to claim 1 wherein said seed metal layer comprises copper.

6. The device according to claim 1 wherein said seed metal layer comprises a stack of a refractory metal layer and a copper layer.

7. The device according to claim 1 wherein said insulating layer is selected from a group consisting of silicon nitride, silicon oxynitride, silicon carbide, silicon dioxide, polyimide, or stacked layers thereof.

8. The device according to claim 1 wherein said metal stud comprises copper.

9. The device according to claim 1 wherein said barrier layer comprises nickel.

10. The device according to claim 1 further comprising an additional barrier layer positioned between said barrier layer and said outermost layer, said additional barrier layer comprising palladium.

11. The device according to claim 1 wherein said outermost bondable metal layer comprises gold.

12. A semiconductor device including a bonding pad having interconnecting metallization protected by an insulating layer, the metallization selectively exposed by a window in the insulating layer, comprising:

a metal stud on the bonding pad having a top surface and a side surface upwardly extending from the insulating layer;

a barrier metal layer conformally covering the top and side surface of the stud; and an bondable metal layer conformally covering the barrier metal layer.

13. A semiconductor device, comprising:

a copper bonding pad having a top surface partially uncovered through a window in an insulating layer;

a copper seed metal layer contacting the bonding pad; and the edge portion of the seed layer overlapping the insulating layer near the window and substantially parallel the bonding pad;

a copper stud extending upwardly from the seed metal, having a top surface and a side surface; the side surface not in contact with the seed metal.

14. The semiconductor device of claim 13, further comprising a barrier metal layer conformally covering the top and side surfaces of the stud; and an bondable metal layer conformally covering the barrier metal layer.

* * * * *